United States Patent [19]
Sera

[11] Patent Number: 5,329,140
[45] Date of Patent: Jul. 12, 1994

[54] THIN FILM TRANSISTOR AND ITS PRODUCTION METHOD
[75] Inventor: Kenji Sera, Tokyo, Japan
[73] Assignee: NEC Corporation, Japan
[21] Appl. No.: 954,309
[22] Filed: Sep. 30, 1992
[30] Foreign Application Priority Data
  Oct. 1, 1991 [JP] Japan .................. 3-253276
[51] Int. Cl.$^5$ .............. H01L 45/00; H01L 29/00
[52] U.S. Cl. ................... 257/66; 257/51;
      257/64; 257/65; 257/347; 257/387; 257/507
[58] Field of Search .............. 257/51, 64, 65, 66,
      257/347, 387, 507

[56] References Cited
U.S. PATENT DOCUMENTS
4,630,089 12/1986 Sasaki et al. .............. 257/66

OTHER PUBLICATIONS
"SID 91 Digest", pp. 539 to 542, 1991.

Primary Examiner—Edward Wojciechowicz
Attorney, Agent, or Firm—Laff, Whitesel, Conte, Saret

[57] ABSTRACT

A thin film transistor having a larger ON-OFF current ratio is provided, in which a first insulating film having a first and second contact holes is formed on a substrate so as to cover a source and drain regions formed therein and a semiconductor film is formed on the first insulating film so as to be connected through the holes respectively to the source and drain regions. A second insulating film is formed on the semiconductor film and a gate electrode is formed thereon so as not be overlapped with the holes. In the offset region between each end of the gate electrode and the corresponding one of the holes, the insulation between the semiconductor film and the source and drain regions is provided by the first insulating film. This semiconductor film is weakly inverted by a drain voltage in the offset region, resulting in obtaining a leak current suppression action. The semiconductor film is preferable to be a polysilicon film.

4 Claims, 1 Drawing Sheet

THIN FILM TRANSISTOR AND ITS PRODUCTION METHOD

BACKGROUND OF THE INVENTION

1. Field of the Invention

This invention relates to a thin film transistor used in liquid crystal display panels, image sensors or the like and its production method.

2. Description of the Related Art

Recently, the technology of forming thin film transistors or thin film diodes on a glass substrate has been realized for making large area liquid crystal display panels having a back light, contact-type image sensors and the like and under such a circumstance, research and developmental activities have been positively progressed. Particularly, the thin film transistor using a polysilicon film as a channel layer has been attracting strong attention lately as one of the most hopeful devices capable of making a thin film device having peripheral driving circuits integrated therewith.

The thin film transistor using a polysilicon film as a channel layer is generally disadvantageous in that it is larger in leak current (OFF current) than a MOSFET or thin film transistor using an amorphous silicon film as a channel layer. Such disadvantage is true when it is used as the switching device of a liquid crystal display panel and when a liquid crystal display panel driving circuit is designed. In addition, the thin film transistor is applied in many cases for devices which require a high driving voltage as the liquid crystal display panel, electroluminescent (EL) display panel or the like and as a result, such a thin film transistor that is high in withstand voltage and small in leak current is needed.

Single-crystal silicon almost does not arise a problem because of the fact that it is small in leak current. On the other hand, polysilicon has many grain boundary traps in its band gap and as a result, an electric current is easy to be flowed between the bands through these grain boundary traps, thus becoming larger in leak current than the single-crystal silicon.

The magnitude of the leak current of a thin film transistor largely depends on the magnitude of an electric field applied to a depletion layer formed at one end of the drain region, so that it has been found that the leak current can be reduced by weakening the electric field applied to the drain region end. As a result, various types of structure has been proposed previously in order to weaken the electric field at one end of the drain region. One example of them is of the offset gate structure in which a gate electrode is formed slightly apart from the drain region.

A conventional stagger-type thin film transistor of the offset gate structure is shown in FIG. 1 as an example. As shown in FIG. 1, a source region 2a and a drain region 2b made of a p or n impurity-doped polysilicon are formed on a substrate 1 at an interval. A polysilicon film 4 becoming a channel layer is formed on the substrate 1 so as to cover the source and drain regions 2a and 2b. The polysilicon film 4 is contacted to the surface of the substrate 1 between the source and drain regions 2a and 2b. On the polysilicon film 4 is formed a gate insulating film 5. Then, a first gate electrode 6 is formed thereon so as to be disposed just above the substrate 1 between the regions 2a and 2b. The first gate electrode 6 is formed so as to have its both ends spaced respectively from the one ends of the source and drain regions 2a and 2b thereby forming offset regions A between the both ends of the first gate electrode 6 and the respective one ends of the source and drain regions 2a and 2b.

Besides, an inter-layer insulating film 3 is formed on the gate insulating film 5 so as to cover this first gate electrode 6. On the inter-layer insulating film 3 is formed a second gate electrode 7 so as to be disposed just above the first gate electrode 6. The both ends of the second gate electrode 7 is slightly extended outwardly of the offset regions A thereby being overlapped with the source and drain regions 2a and 2b, respectively.

The thin film transistor as shown above makes possible that by applying a voltage to the second gate electrode 7 thereby weakly inverting the channel layer, namely, the polysilicon film 4, of the offset region A on the side of the drain region 2b, the leak current can be suppressed without reducing the ON current characteristic. With this structure, however, it is disadvantageous in that the second gate electrode 7 is required to be provided additionally and as a result, it becomes complex in structure as well as is required to form one layer additionally for wiring the second gate electrode 7. In addition, if the width of the offset region A, that is, the distance of each end of the first gate electrode 6 and the corresponding end of each of the source and drain regions 2a and 2b is increased, the maximum ON current is disadvantageously decreased thereby degrading the characteristics of the transistor itself. This means that the offset gate one shown in FIG. 1 is difficult to be realizably used in liquid crystal display panel.

Another example of the conventional stagger-type thin film transistor is shown in FIG. 2. The thin film transistor shown in FIG. 2 can be eliminated the second gate electrode 7 shown in FIG. 1 by providing the source/drain electrodes with the functions of the second gate electrode 7, resulting in the elimination of the disadvantages due to the second gate electrode 7.

A source region 12a and a drain region 12b made of impurity-doped polysilicon are formed from each other on a glass substrate 11 at an interval. A polysilicon film 14 becoming a channel layer is formed thereon so as to cover the source and drain regions 12a and 12b. The polysilicon film 14 is contacted to the surface of the substrate 11 between the source and drain regions 12a and 12b. A gate insulating film 15 is formed on the polysilicon film 14. On the gate insulating film 15, a gate electrode 16 is formed so as to be disposed between the source and drain regions 12a and 12b. The gate electrode 16 is formed so as to have its both ends spaced respectively from the one ends of the source and drain regions 12a and 12b thereby forming offset regions B between the both ends of the gate electrode 16 and the respective one ends of the source and drain regions 12a and 12b. Besides, an inter-layer insulating film 13 is formed on the gate insulating film 15 so as to cover the gate electrode 16.

This transistor is similar in structure to that shown in FIG. 1. In this transistor, however, a source electrode 18a and a drain electrode 18b connected via contact holes 19 formed passing through the inter-layer insulating film 13, gate insulating film 15 and polysilicon film 14 respectively to the source region 12a and drain region 12b are formed so as to be extended inwardly exceeding the respective offset regions B (that is, horizontally extended to the side of the gate electrode 16) on the inter-layer insulating film 13, thus having their horizontally extended ends overlapped with the gate electrode 16.

In the thin film transistor shown in FIG. 2, a voltage is not applied to the drain electrode 18b when the transistor is OFF, so that the leak current becomes small. When the transistor is ON, a voltage applied to the drain electrode 18b acts directly to the polysilicon film 14 of the offset region B, so that the polysilicon film 14 can be weakly inverted. Thus, the drain electrode 18b can provide the same functions as those of the second electrode 7 shown in FIG. 1 and as a result, the leak current can be suppressed without degrading the ON current characteristic of the transistor.

According to the structure as shown in FIG. 2, the difficult points pointed out in the preceding example can be eliminated, being advantageous in that the same effects as of the structure shown in FIG. 1 can be obtained by producing as the conventional thin film transistor. With the structure as shown in FIG. 2, such a disadvantage that the maximum ON current is decreased if the width of the offset region B is increased is still remained to be overcome.

Various types of structure including a planar, stagger and the like are known for the thin film transistor. Particularly referring to the planar-type one, it is disadvantageous that the leak current is rapidly increased when a voltage applied between the source and drain regions is increased. This is because a high electric field is applied at the end of the drain region by the voltage applied between the source and drain regions and as a result, there generates an electric field emission current between the bands. Accordingly, the planar-type one is not appropriate to be used for the application that requires a low leak current.

In the conventional thin film transistor shown in FIG. 1, however, there exist two layers consisting of the gate insulating film 5 and inter-layer insulating film 3 between the polysilicon film 4 and second electrode 7. As a result, the polysilicon film 4 in the offset region A is applied through the two layers with an electric field. Similarly, in the conventional one as shown in FIG. 2, there exist two layers consisting of the gate insulating film 15 and interlayer insulating film 13 between the polysilicon film 14 and the area of the drain electrode 18b serving to act the functions of the second electrode 7 and as a result, the polysilicon film 14 of the offset region B is applied through the two layers with an electric field. Accordingly, the voltage applied to the second electrode 7 or the drain electrode 18b is not effectively acted on the polysilicon film 4 or 14 respectively of the offset region A or B, so that there arises a problem that maximum ON current degrades when the width of the offset region A or B is made large.

In the transistor shown in FIG. 2, in addition, the voltage applied to the polysilicon film 14 of the offset region B is always equal to a drain voltage, so that the leak current suppression effect depends on the drain voltage and as a result, there arises a problem that when the drain voltage is low, satisfiable effects cannot be obtained.

Thus, an object of this invention is to provide a thin film transistor which can be made smaller in leak current than would be obtained conventionally without degradation of maximum ON current and a production method of the same.

SUMMARY OF THE INVENTION

In a first aspect of this invention, a thin film transistor is provided. This transistor has a first insulating film formed on an substrate so as to cover a source region and a drain region formed thereon at an interval and having a first and second contact holes formed therethrough, a semiconductor film formed on the first insulating film so as to be connected through the first and second contact holes respectively to the source and drain regions, a second insulating film formed on the semiconductor film and a gate electrode formed on the second insulating film so as not to be overlapped with the first and second contact holes. In the space between each end of the gate electrode and the corresponding one of the contact holes, there exists the first insulating film between the semiconductor film and each of the source and drain regions.

In the thin film transistor of this aspect, the source and drain regions are insulated at their ends with the semiconductor film by the first insulating film, so that the semiconductor film is weakly inverted at the end thereof on the gate side of the drain region by a voltage applied to the drain region. Accordingly, the leak current suppression action similar to that of a conventional one can be obtained.

In addition, the source and drain regions are insulated at their ends with the semiconductor film by the first insulating film only and the thickness of the first insulating film can be controlled independently and as a result, by forming the first insulating film thinly, the electric field applied to the semiconductor film can be increased. Therefore, the leak current can be further suppressed than would be obtained previously.

In addition, the source and drain regions are insulated at their ends with the semiconductor film by the first insulating film only and the thickness of the first insulating film can be formed thinly, there is less possibility that the maximum ON current is decreased due to the increase of the width of the offset region.

Accordingly a thin film transistor having a larger ON-OFF current ration can be realized.

In a second aspect of this invention, a production method of the thin film transistor of the first aspect is provided. This production method comprises the steps of forming a source region and drain region of an electroconductive film on one main plane of an substrate at an interval, forming a first insulating film having a first and second contact holes extended respectively to the the source and drain regions on the substrate, forming a semiconductor film on the first insulating film so as to be contacted through the first and second contact holes respectively to the source and drain regions, forming a second insulating film on the semiconductor film, and forming a gate electrode of an electroconductive film on the second insulating film so as not to be overlapped with the first and second contact holes, so that in the space between each end of the gate electrode and the corresponding one of the first and second contact holes, there exists the first insulating film between the semiconductor film and the source and drain regions.

According to the production method of this aspect, the thin film transistor descried in the first aspect can be produced with a good reproducibility substantially by the conventional method.

The semiconductor film for channel layer use is preferable to be formed of polysilicon.

BRIEF DESCRIPTION OF THE DRAWINGS

FIGS. 3A to 3C are cross-sectional views showing a production method of a thin film transistor according to an embodiment of this invention in the order of processes to be carried out, in which:

FIG. 3A cross-sectionally shows the state that a source region and a drain region are formed on a substrate;

FIG. 3B cross-sectionally shows the state that an inter-layer insulating film and a polysilicon film are formed on the substrate shown in FIG. 3A in this order; and FIG. 3C cross-sectionally shows the state that a gate insulating film and a gate electrode are formed on the polysilicon film shown in FIG. 3B in this order.

DESCRIPTION OF THE PREFERRED EMBODIMENTS

One preferred embodiment of this invention will be described below while referring to FIGS. 3A to 3C.

Figure 3A:
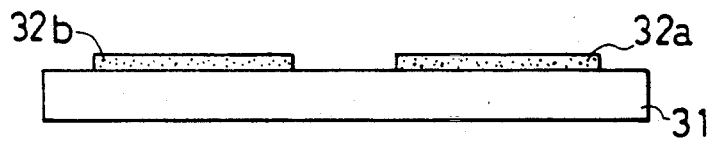
Figure 3B:
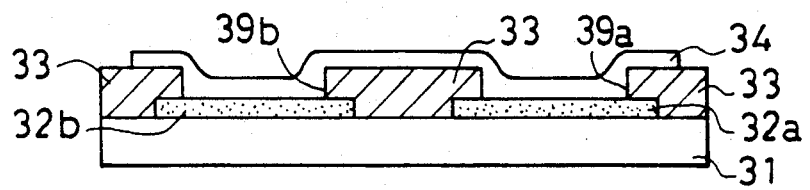
Figure 3C:
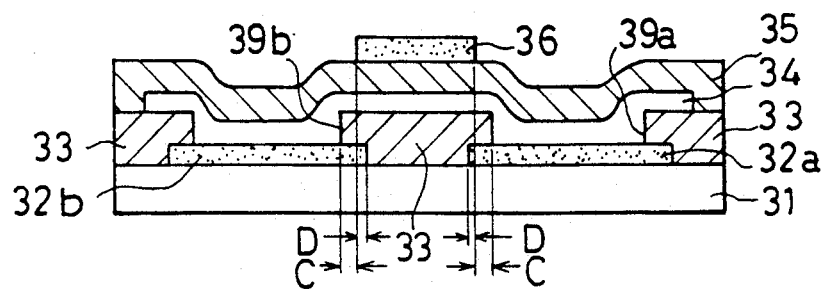

As shown in FIG. 3C, a thin film transistor of this invention is of the stagger structure. A source region 32a and drain region 32b of p or n impurity-doped polysilicon are formed in pair on a glass substrate 31 at an interval. An inter-layer insulating film 33 is formed on the substrate 31 so as to cover the source and drain regions 32a and 32b and then, a polysilicon film 34 becoming a channel layer is formed thereon so as to cross-link the source and drain regions 32a and 32b. The inter-layer insulating film 33 has a pair of contact holes 39a and 39b formed therein at their positions where correspond to the source and drain regions 32a and 32b respectively. As a result, the polysilicon film 34 is connected through the contact holes 39a and 39b respectively to the source and drain regions 32a and 32b.

On the polysilicon film 34 are formed a gate insulating film 35 and a gate electrode 36 in this order. Here, the gate electrode 36 is formed thereon so as to be positioned just above the space between the paired source and drain regions 32a and 32b. The positional relations between the gate electrode 36 and the source and drain regions 32a and 32b, and the contact holes 39a and 39b are as follows;

The length of the gate electrode 36 is slightly larger than the space distance between the source and drain regions 32a and 32b thereby to be partially overlapped with the respective ends of the source and drain regions 32a and 32b. Thus, an overlap region D is formed at each end of the gate electrode 36. The length of the gate electrode 36 also is slightly smaller than the length of the inter-layer insulating film 33 between the source and drain regions 32a and 32b, that is, the length of the distance between the contact holes 39a and 39b, thus being formed an offset region C at each end of the gate electrode 36. In the offset region C, the insulation between the polysilicon film 34 and each of the source and drain regions 32a and 32b is made by the inter-layer insulating film 33.

Figure 2:
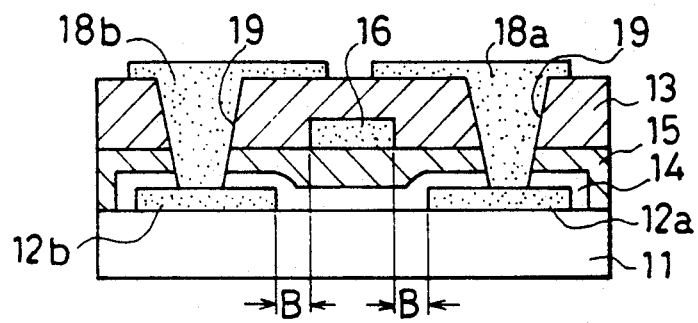
FIG. 2 is a cross-sectional view of another example of the conventional thin film transistor.

With the thin film transistor of this embodiment structured as above, when a voltage is applied between the source and drain regions 32a and 32b, the channel layer, that is, the polysilicon film 34 is weakly inverted by the drain voltage in the offset region C on the side of the drain region 32b and as a result, similar to the case of being the conventional one already described above, the leak current suppression action can be obtained. In addition, the voltage applied to the gate electrode 36 is applied to the polysilicon film 34 only through the gate insulating film 35 and yet, as the gate insulating film 35 can be formed thin in thickness, an electric field having a strength, for example, twice that of the conventional one shown in FIG. 2 can be applied to the polysilicon film 34 in the offset regions C. As a result, the leak current suppression action can be exerted further effectively, thus being capable of extremely reducing the leak current (for example, to the half).

In addition, the thin film transistor of this embodiment is simple in structure and does not need to provide an excessive layer additionally. And even if the width of the offset region C is increased, there is no possibility that the characteristics of the transistor itself is degraded due to the reduction of the maximum ON current. Accordingly, the ON-OFF current ratio is further increased, thus being adapted to be used for the liquid crystal display application.

Figure 1:
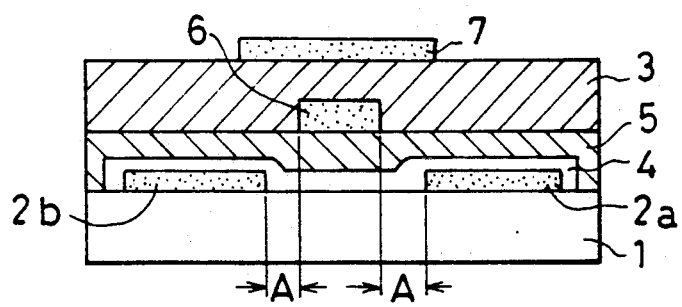
FIG. 1 is a cross-sectional view of an example of a conventional thin film transistor.

It can be said that the transistor of this embodiment is equivalent to a transistor in which the second gate electrode of the conventional thin film transistor shown in FIG. 1 is disposed on the substrate side and formed by the source and drain regions.

Next, a production method of the thin film transistor explained above will be described below.

First, as shown in FIG. 3A, a polysilicon film made low in resistance by doping an impurity is formed on the glass substrate 31 by a CVD method and patterned in a predetermined shape by etching, thus forming the source region 32a and drain region 32b in pair on the substrate 31 at an interval.

Then, the inter-layer insulating film 33 is formed by the CVD method on the substrate 31 so as to cover the source and drain regions 32a and 32b and thereafter, the contact holes 39a and 39b are formed in pair in the inter-layer insulating film 33 by an etching method so as to be extended respectively to the source region 32a and drain region 32b.

Subsequently, the polysilicon film 34 becoming a channel layer is formed on the inter-layer insulating film 33 having the contact holes 39a and 39b formed therethrough by the CVD method and patterned in a predetermined shape by etching. The polysilicon film 34 is contacted through the contact holes 39a and 39b respectively to the upper surfaces of the source and drain regions 32a and 32b, the state of which is shown in FIG. 3B. The paired contact holes 39a and 39b are required to have their forming positions and sizes designed so as not to be overlapped with a gate electrode which is to be formed in the subsequent process.

Next, the gate insulating film 35 is formed on the inter-layer insulating film 33 thereon by the CVD method so as to cover the polysilicon film 34 and then, a thin film is formed thereon by the CVD method and patterned in a predetermined shape by etching, thus forming the gate electrode 36 and a source electrode and drain electrode (not shown). Thus, the thin film transistor of this invention structured as shown in FIG. 3C can be obtained.

When the gate electrode 36 is to be formed, the mask to be used for etching is required to have the size and forming position designed so that the both ends of the gate electrode 36 can be partially overlapped respectively with the source and drain regions 32a and 32b and set off respectively with the contact holes 39a and 39b.

According to this production method, the thin film transistor of this embodiment can be produced with a good reproducibility substantially as conventional stagger-type ones without adding any process newly.

In addition, in this embodiment, the gate electrode 36 is partially overlapped with each of the source and drain regions 32a and 32b, but not necessarily limited thereto. When considering upon the positioning accuracy of the mask when etching, it is preferable to be overlapped therewith as above. Further in addition, a polysilicon film is used as the channel layer, but not limited thereto, and other thin films made, for example, of amorphous silicon may be employed.

What is claimed is:

1. A thin film transistor comprising:
    a source region and a drain region formed of an electroconductive film on an substrate at an interval;
    a first insulating film formed on said substrate so as to cover said source region and said drain region and having a first contact hole on said source region and a second contact hole on said drain region;
    a semiconductor film formed on said first insulating film so as to be connected through said first contact hole and said second contact hole formed in said first insulating film respectively to said source region and said drain region;
    a second insulating film formed on said semiconductor film; and
    a gate electrode formed of an electroconductive film on said second insulating film so as not to be overlapped with said first contact hole and said second contact hole;
    wherein in the space between each end of said gate electrode and the corresponding one of said first contact hole and said second contact hole, there exists said first insulating film between said semiconductor film and said source region and said drain region.

2. The thin film transistor as claimed in claim 1, wherein said semiconductor film is a polysilicon film.

3. The thin film transistor as claimed in claim 1, wherein said gate electrode is partially overlapped with said source region and said drain region.

4. The thin film transistor as claimed in claim 2, wherein said gate electrode is partially overlapped with said source region and said drain region.

* * * * *